United States Patent
Kuo et al.

(10) Patent No.: US 10,804,206 B2
(45) Date of Patent: Oct. 13, 2020

(54) DEEP TRENCH PROTECTION

(71) Applicant: Taiwan Semiconductor Manufacturing Co., Ltd., Hsin-Chu (TW)

(72) Inventors: Fu-Chiang Kuo, Hsinchu (TW); Tao-Cheng Liu, Hsinchu (TW); Shih-Chi Kuo, Taipei (TW); Tsung-Hsien Lee, Tainan (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 15/904,013

(22) Filed: Feb. 23, 2018

(65) Prior Publication Data
US 2019/0035736 A1   Jan. 31, 2019

Related U.S. Application Data

(60) Provisional application No. 62/539,038, filed on Jul. 31, 2017.

(51) Int. Cl.
| | | |
|---|---|---|
| *H01L 21/784* | (2006.01) | |
| *H01L 23/538* | (2006.01) | |
| *H01L 21/768* | (2006.01) | |
| *H01L 21/762* | (2006.01) | |
| *H01L 23/532* | (2006.01) | |
| *H01L 21/78* | (2006.01) | |

(52) U.S. Cl.
CPC .... *H01L 23/5384* (2013.01); *H01L 21/76229* (2013.01); *H01L 21/76843* (2013.01); *H01L 21/78* (2013.01); *H01L 23/53266* (2013.01)

(58) Field of Classification Search
CPC ............... H01L 21/784; H01L 21/823475
See application file for complete search history.

(56) References Cited

U.S. PATENT DOCUMENTS

| | | | | |
|---|---|---|---|---|
| 2009/0280584 | A1* | 11/2009 | Parekh | H01L 21/78 438/18 |
| 2010/0301460 | A1* | 12/2010 | Zhang | H01L 21/563 257/622 |
| 2011/0031633 | A1* | 2/2011 | Hsu | H01L 21/76898 257/777 |
| 2011/0039397 | A1* | 2/2011 | Zhu | H01L 21/78 438/462 |
| 2013/0307125 | A1* | 11/2013 | Huang | H01L 23/3121 257/623 |
| 2015/0123285 | A1* | 5/2015 | Lin | H01L 21/481 257/774 |
| 2015/0228557 | A1* | 8/2015 | Cheng | H01L 23/3114 257/622 |
| 2017/0256638 | A1* | 9/2017 | Macelwee | H01L 29/2003 |

* cited by examiner

*Primary Examiner* — George R Fourson, III
(74) *Attorney, Agent, or Firm* — Duane Morris LLP

(57) ABSTRACT

A semiconductor device includes: at least one conductive feature disposed on a substrate; at least one dielectric layer overlying the substrate, a trench structure extending through the at least one dielectric layer; and a protection layer overlaying the trench structure.

17 Claims, 9 Drawing Sheets

DEEP TRENCH PROTECTION

CROSS-REFERENCE TO RELATED APPLICATION

The present application claims priority to U.S. Provisional Patent Application No. 62/539,038, filed on Jul. 31, 2017, which is incorporated by reference herein in its entirety.

BACKGROUND

The semiconductor industry has constantly pursued higher device densities with lower costs. Technological advances in semiconductor device, or integrated circuit (IC), materials, designs and manufacturing processes have produced progressively smaller circuits. In the course of this IC evolution, functional density (for example, the number of interconnected devices per chip area) has generally increased while geometry sizes have decreased. This scaling down process generally provides benefits by increasing production efficiency and lowering associated costs However, increased functional density has increased the complexity of ICs, such as by decreasing the distance between interconnected devices and the number of dielectric layers per chip area. Accordingly, there may be a greater chance of failures per chip area during semiconductor processing due to at least the decreased distance between (and increased number of) interconnected devices and dielectric layers.

Therefore, conventional semiconductor device fabrication and processing techniques have not been entirely satisfactory.

BRIEF DESCRIPTION OF THE DRAWINGS

Aspects of the present disclosure are best understood from the following detailed description when read with the accompanying figures. It is noted that various features are not necessarily drawn to scale. In fact, the dimensions and geometries of the various features may be arbitrarily increased or reduced for clarity of discussion.

DETAILED DESCRIPTION OF EXEMPLARY EMBODIMENTS

Figure 1:
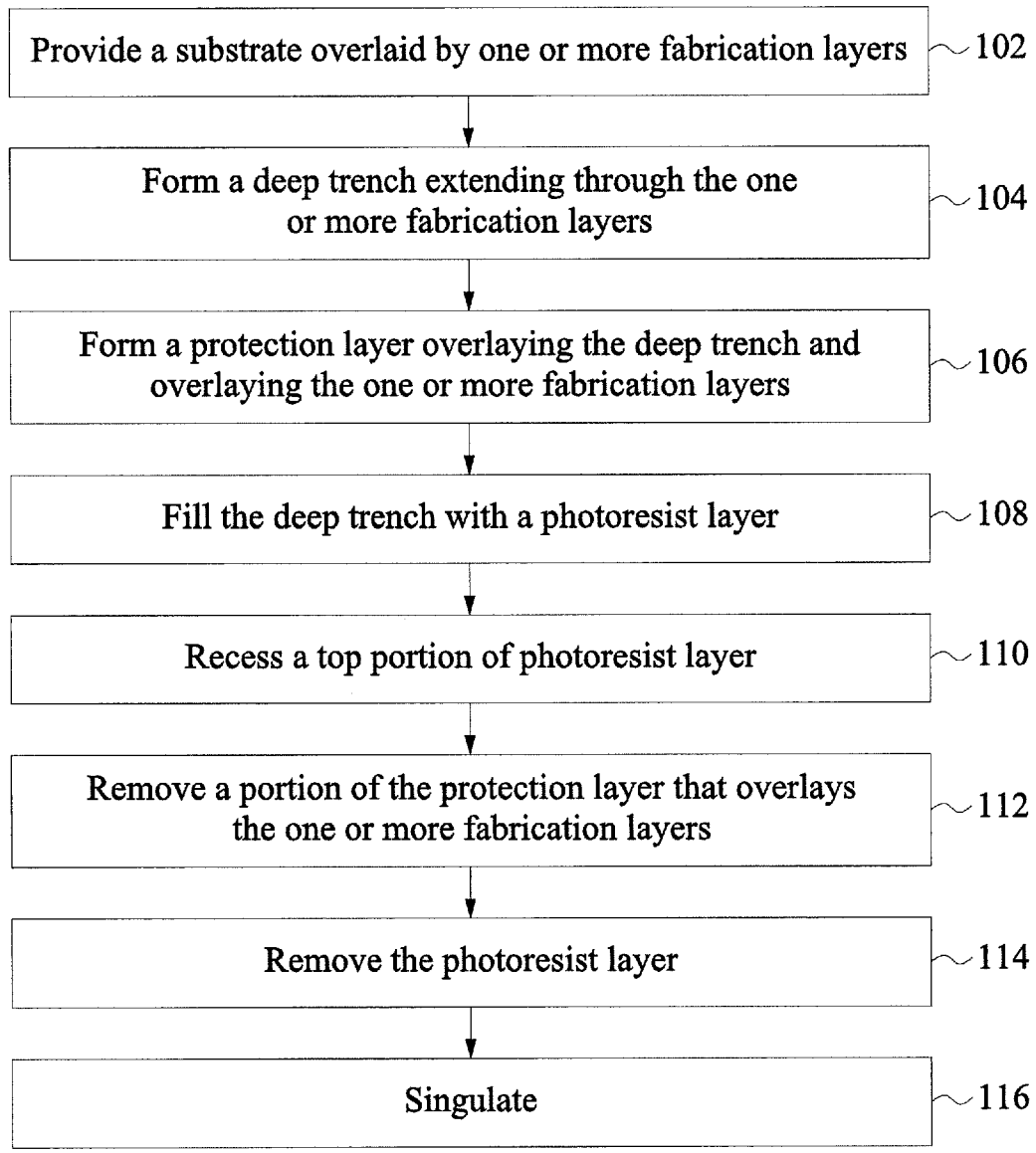
FIG. 1 illustrates a flow chart of an exemplary method for forming a semiconductor device including a deep trench protection layer, in accordance with some embodiments.

The following disclosure describes various exemplary embodiments for implementing different features of the subject matter. Specific examples of components and arrangements are described below to simplify the present disclosure. These are, of course, merely examples and are not intended to be limiting. For example, it will be understood that when an element is referred to as being "connected to" or "coupled to" another element, it may be directly connected to or coupled to the other element, or one or more intervening elements may be present.

In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure provides various embodiments of a semiconductor device with a layer of protection for trenches (e.g., trench structures). In accordance with various embodiments, this layer of protection may protect the side walls of trenches where interfaces of dielectric layers may be located, as discussed further below. These dielectric layers (and substrate on which the dielectric layers are formed) may have various conductive features (e.g., doped wells, voltage sources, metallization layers) embedded therein that are interconnected via conductive structures (e.g., vias or conductive lines).

In certain embodiments, these dielectric layers are formed layer by layer on top of the substrate. Each dielectric layer may include an interface that delineates when one dielectric layer ends and another begins. For example, there may be an interface between different dielectric layers and an interface between a dielectric layer and a substrate. Also, the dielectric layers may have conductive structures embedded therein. These conductive structures may be configured to provide an electrical connection to conductive features formed on (or within) the substrate.

During semiconductor processing and use, the dielectric layers and the interfaces between each of the dielectric layers and between a dielectric layer and the substrate may be exposed to damaging mediums, which may damage (or undesirably change) the dielectric layers and/or the conductive features or conductive structures embedded within the dielectric layer. These damaging mediums may include chemicals (e.g., acidic or basic chemicals used in washing or etching), high intensity light (e.g., from a laser used to etch a semiconductor device), or reactive gases (e.g., metalizing, oxidizing, or nitrating gases). These damaging mediums may damage areas of the dielectric layers exposed to the damaging mediums and reach (e.g., directly reaching or permeating through the damaging mediums) the conductive features and/or conductive structures embedded within the dielectric layers. Also, these damaging mediums may enter the semiconductor device through the interfaces of the dielectric layers to reach the conductive features and/or conductive structures embedded in the dielectric layer. Accordingly, the areas near the interfaces of the dielectric layers are especially prone to damage. Upon reaching the conductive features and/or conductive structures, the damaging medium(s) may begin to damage the conductive features and/or conductive structures, such as by transforming or disintegrating the conductive features and/or conductive structures and thus decreasing yields for semiconductor device fabrication and use.

During semiconductor processing, trenches may be formed that pass through one or more dielectric layers and/or one or more substrates that the one or more dielectric layers are formed upon. These trenches may perform various functions during semiconductor device processing, such as providing electrical isolation between different areas of the semiconductor device (e.g., between conductive features such as NMOS (n-channel metal-oxide-semiconductor field-effect transistor) and PMOS (p-channel metal-oxide-semiconductor field-effect transistor) regions) and/or providing physical separation (e.g., between semiconductor dies for singulation purposes). In particular, deep trenches may be formed between portions of a semiconductor device (e.g., IC or wafer) that are designed to be isolated from each other during semiconductor processing. For example, a deep trench can be formed as a ring to surround a respective semiconductor device to isolate the semiconductor device from other semiconductor devices so that the semiconductor device (e.g., a die) can be more easily disassembled (e.g., singulated) for further processing or packaging (e.g., disassembling each die from the wafer).

Semiconductor devices may be designed to provide deep trenches with not only a non-material gap separation (e.g., an air separation between the walls of the deep trench) but also a physical material separation between a wall of the deep trench and conductive features and/or conductive structures embedded within the dielectric layers. This separation may be to delineate between independent parts of a semiconductor device. For example, a deep trench may surround a die and have a non-material separation between the die and other dies on a semiconductor device.

In some embodiments, a deep trench may be approximately 0.9 to 1.1 um (micrometer) (e.g., 0.97 um) at the narrowest cross section and approximately 5.0 to 6.0 um (e.g., 5.43 um) of depth into a substrate after extending through the one or more dielectric layers. In some embodiments, a deep trench may extend substantially 5.43 um of depth into a substrate after extending through the one or more dielectric layers (which each include respective conductive features and/or conductive structures). Also, the material separation between a wall of the deep trench and the conductive features and/or conductive structures embedded within a dielectric layer may be approximately 1.1 to 1.3 um (e.g., 1.2 um), in accordance with some embodiments.

However, as functional density (for example, the number of interconnected devices per chip area) has generally increased while geometry sizes (i.e., the overall size of the IC package or footprint) have decreased, these material and non-material separations featured by the deep trench have become smaller and less robust and may lead to more deep trench separation failures (for example due to damaging mediums reaching conductive features and/or conductive structures) and a decrease of yield.

As introduced above, without a protection layer along a wall of the deep trench, the dielectric layers (and associated conductive features and/or conductive structures) may become damaged by damaging mediums during semiconductor processing or use. Furthermore, each of the interfaces may act as a weak point on the semiconductor device from where damaging mediums may more easily penetrate into the semiconductor device and damage the semiconductor. Therefore, as will be discussed further below, designing semiconductor devices to include a protection layer within a deep trench, and specifically along a wall of a deep trench is technically advantageous in preventing damage to the semiconductor device and/or a decrease of yield.

FIG. 1 illustrates a flowchart of a method 100 to form a semiconductor device according to one or more embodiments of the present disclosure. It is noted that the method 100 is merely an example, and is not intended to limit the present disclosure. Accordingly, it is understood that additional operations may be provided before, during, and after the method 100 of FIG. 1, certain operations may be omitted, and some other operations may only be briefly described herein.

In some embodiments, operations of the method 100 may be associated with the cross-sectional views of a semiconductor device at various fabrication stages as shown in FIGS. 2A, 2B, 2C, 2D, 2E, 2F, 2G, and 2H respectively, which will be discussed in further detail below.

Referring now to FIG. 1, the method 100 starts with operation 102 in which a semiconductor substrate overlaid with one or more dielectric layers is provided. The method 100 continues to operation 104 in which a deep trench is formed that extends through the one or more dielectric layers. The method 100 continues to operation 106 in which a protection layer overlaying the deep trench and overlaying the one or more dielectric layers is formed. The method 100 continues to operation 108 where the deep trench is filled with a photoresist layer. The method 100 continues to operation 110 where a top portion of the photoresist layer is recessed. The method 100 continues to operation 112 where a portion of the protection layer that overlays the one or more dielectric layers is removed. The method 100 continues to operation 114 in which the photoresist layer is removed. A deep trench with a protection layer is formed after the photoresist layer is removed. The method 100 continues to operation 116 where the semiconductor device is disassembled (e.g., cut) along the deep trench to singulate individual dies from each other.

As mentioned above, FIG. 2A through FIG. 2G illustrate, in a cross-sectional view, a portion of a semiconductor device 200 at various fabrication stages of the method 100 of FIG. 1. The semiconductor device 200 may include, be included in, or be a microprocessor, memory cell, wafer, and/or other integrated circuit (IC). Also, FIGS. 2A through 2G are simplified for a better understanding of the concepts of the present disclosure. For example, although the figures illustrate the semiconductor device 200, it is understood the IC may comprise a number of other devices such as resistors, capacitors, inductors, fuses, etc., which are not shown in FIGS. 2A-2G, for purposes of clarity of illustration.

Figure 2A:
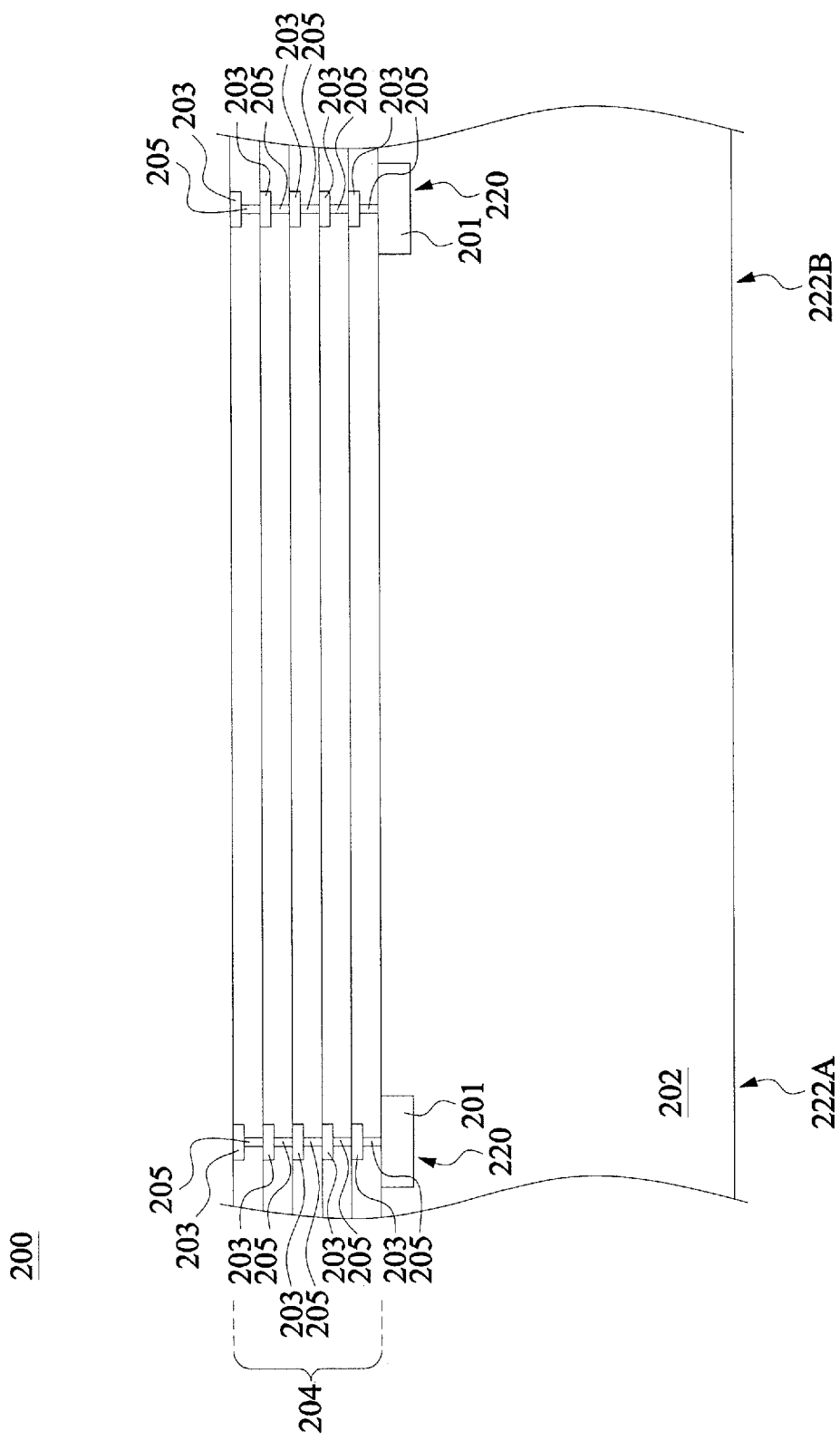
FIGS. 2A, 2B, 2C, 2D, 2E, 2F, 2G, and 2H illustrate cross-sectional views of an exemplary semiconductor device during various fabrication stages, made by the method of FIG. 1, in accordance with some embodiments.

FIG. 2A is a cross-sectional view of the semiconductor device 200 including a substrate 202 with at least one dielectric layer 204 at one of the various stages of fabrication corresponding to operation 102 of FIG. 1, in accordance with some embodiments. Although the semiconductor device 200 in the illustrated embodiment of FIG. 2A includes only five dielectric layers 204 and one substrate 202 it is understood that the illustrated embodiment of FIG. 2A and the following figures are merely provided for illustration purposes. Thus, the semiconductor device 200 may include any desired number of dielectric layers and substrate(s) while remaining within the scope of the present disclosure.

In some embodiments, the substrate 202 and/or the dielectric layers 204 includes a silicon substrate. Alternatively, the substrate 202 and/or the dielectric layers 204 may include other elementary semiconductor material such as, for example, germanium. The substrate 202 and/or the dielectric layers 204 may also include a compound semiconductor such as silicon carbide, gallium arsenic, indium arsenide, and indium phosphide. The substrate 202 and/or the dielectric layers 204 may include an alloy semiconductor such as silicon germanium, silicon germanium carbide, gallium arsenic phosphide, and gallium indium phosphide. In one embodiment, the substrate 202 and/or the dielectric layers 204 includes an epitaxial layer. For example, the substrate and/or the dielectric layers 204 may have an epitaxial layer overlying a bulk semiconductor. Furthermore, the substrate 202 and/or the dielectric layers 204 may include a semiconductor-on-insulator (SOI) structure. For example, the substrate may include a buried oxide (BOX) layer formed by a process such as separation by implanted oxygen (SIMOX) or other suitable technique, such as wafer bonding and grinding.

In some embodiments, the substrate 202 and/or the dielectric layers 204 may have various conductive features and/or conductive structures 220 embedded within the substrate 202 and/or the dielectric layers 204, such as conductive features (e.g., conductive feature 201) that are interconnected via conductive structures (e.g., vias 205 and conductive lines 205). As introduced above conductive features 201 may include various p-type doped regions and/or n-type doped regions, implemented by a process such as ion implantation and/or diffusion. Those doped regions include n-well, p-well, light doped region (LDD), heavily doped source and drain (S/D), and various channel doping profiles configured to form various integrated circuit (IC) devices, such as a complimentary metal-oxide-semiconductor field-effect transistor (CMOSFET), imaging sensor, and/or light emitting diode (LED). The substrate 202 and/or dielectric layers 204 may further have other functional features such as a resistor or a capacitor formed in and on the substrate and/or dielectric layers. The substrate 202 and/or dielectric layers may further have lateral isolation features provided therein to separate various devices formed in the substrate 202, as discussed in further detail below. In accordance with various embodiments, such various devices can further include silicide disposed on S/D, gate electrode and other device features for reduced contact resistance when coupled to output and input signals.

As mentioned above, conductive structures may include vias 205 and conductive lines 203. In some embodiments, the via 205 (or via structure) and/or the conductive line 203 (or conductive line structure) includes a metal material such as, for example, copper (Cu), tungsten (W), or a combination thereof. In some other embodiments, the via 205 may include other suitable metal materials (e.g., gold (Au), cobalt (Co), silver (Ag), etc.) and/or conductive materials (e.g., polysilicon) while remaining within the scope of the present disclosure. Similarly, since a material of a via 205 may be used by other conductive structures, for ease of discussion, the material of a via 205 is generally referred to herein as "material M."

These conductive structures may be part of an inter-metal dielectric (IMD) layer, such that a conductive structure (e.g., a via 205) is configured to extend through the IMD layer to couple itself to a conductive feature. The IMD layer may include a material that is at least one of: silicon oxide, a low dielectric constant (low-k) material, other suitable dielectric material, or a combination thereof. The low-k material may include fluorinated silica glass (FSG), phosphosilicate glass (PSG), borophosphosilicate glass (BPSG), carbon doped silicon oxide ($SiO_xC_y$), Black Diamond® (Applied Materials of Santa Clara, Calif.), Xerogel, Aerogel, amorphous fluorinated carbon, Parylene, BCB (bis-benzocyclobutenes), SiLK (Dow Chemical, Midland, Mich.), polyimide, and/or other future developed low-k dielectric materials. Since the material of the IMD layer may be used by other dielectric layers, for ease of discussion, the material is herein referred to as "material D."

The various conductive structures may be formed by at least some of the following process steps: using chemical vapor deposition (CVD), physical vapor deposition (PVD), spin-on coating, and/or other suitable techniques to deposit the material D over the substrate 202 and the conductive feature 204 to form an IMD layer; performing one or more patterning processes (e.g., a lithography process, a dry/wet etching process, a cleaning process, a soft/hard baking process, etc.) to form an opening through the initial first IMD layer; using CVD, PVD, and/or other suitable techniques to deposit the aforementioned material B along a bottom surface and sidewalls of the opening to surround the opening; using CVD, PVD, E-gun, and/or other suitable techniques to fill the opening with the material M, and polishing out excessive material M to form the a conductive structure (e.g., a via 205).

As discussed above, a deep trench may provide comprehensive lateral separation, such as between independent portions of a semiconductor device not in conductive communication with other independent portions of the semiconductor device (such as different dies 222A, 2228 on a semiconductor device 200, such as a wafer). For example, a deep trench may provide a non-material separation of approximately 0.97 um at the narrowest cross-section and a material separation of substantially 1.2 um. Each die 222A, 222B on the semiconductor device may have conductive features and/or conductive structures 220 that are independent from (e.g., do not share a functional conductive interconnection with) conductive features and/or conductive structures 220 on other dies 222A, 222B. Accordingly, as will be discussed in further detail in connection with FIG. 2H, the semiconductor device 200 may be disassembled along the deep trench 206 to cingulate dies from each other.

Also, due to the larger scale of deep trench geometry relative other structures in a semiconductor device, deep trenches may not have been designed with an additional protection layer as the material and non-material separations of a deep trench may have been sufficient to avoid damage to a semiconductor device (and internal conductive features and/or conductive structures). However, as the material and/or non-material separations of deep trenches begin to scale down and/or vary with different applications of the deep trench in a semiconductor device, the additional protection afforded by a protection layer for a deep trench may advantageously increase yield and reduce damage to semiconductor devices by damaging mediums (relative to deep trench designs without a protection layer).

Figure 2B:
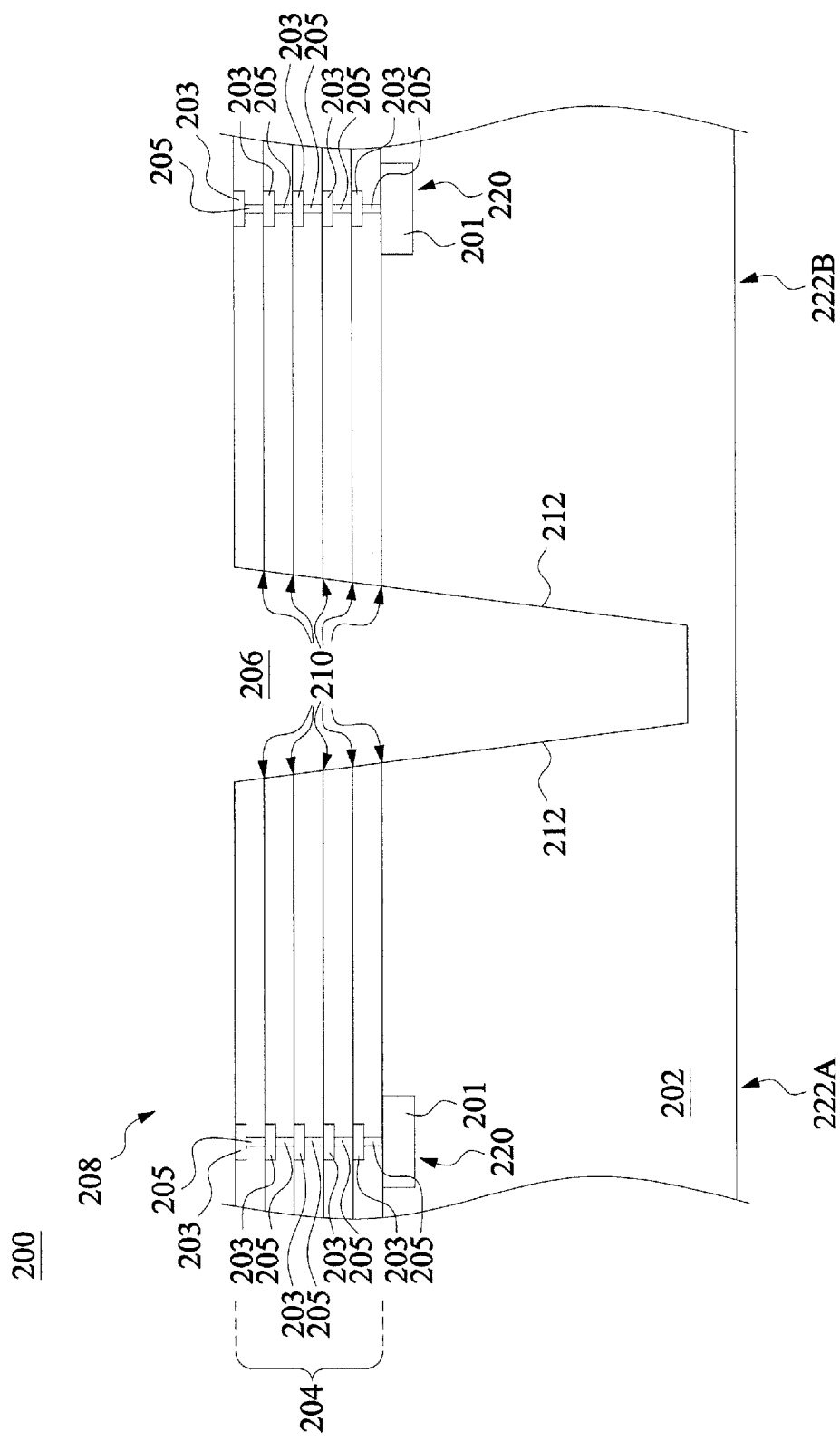

FIG. 2B is a cross-sectional view of the semiconductor device 200 including a deep trench 206 extending through the one or more dielectric layers and (optionally) the substrate at one of the various stages of fabrication that corresponds to operation 104 of FIG. 1, in accordance with some embodiments. As shown, the deep trench extends 206 from an external surface 208 of the semiconductor device 200 through the dielectric layers 204 and into the substrate 202. Also, various interfaces are revealed along the walls 212 of the deep trench 206.

In some embodiments, the formation of the deep trench may include at least one of the following process steps: performing one or more (dry/wet) etching processes to etch away the one or more dielectric layers and the substrate; and performing a cleaning process to remove excessive material due to etching processes.

As discussed above, transitions may be weak points where the different materials of the different dielectric layers and substrate do not adhere as well as a cohesive monolithic material within a single dielectric layer or substrate. Damaging mediums may more easily reach conductive features and/or conductive structures in the semiconductor device through these transitions than through diffusing through the monolithic materials of the dielectric layers and/or substrate. Advantageously, as discussed further below and introduced above, adding a protection layer that is resistant to the damaging mediums along the walls 212 (e.g., sides) of the deep trench can better protect the conductive features and/or conductive structures within the semiconductor device than without such a protection layer.

Figure 2C:
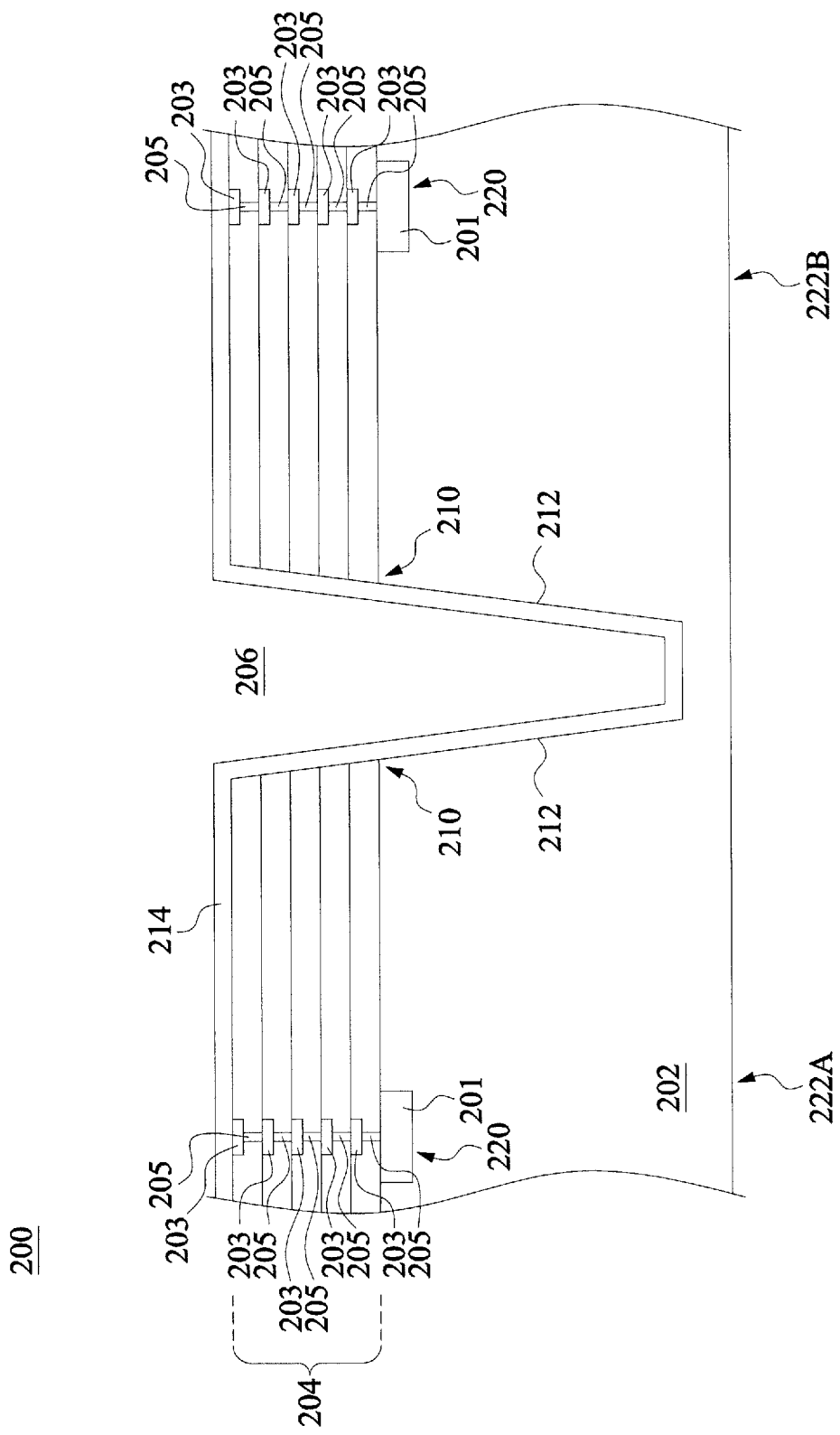

FIG. 2C is a cross-sectional view of the semiconductor device 200 including a protection layer 214 overlaying the deep trench 206 and overlaying the one or more dielectric layers 204 at one of the various stages of fabrication that corresponds to operation 106 of FIG. 1, in accordance with some embodiments. As shown, the protection layer overlays the walls 212 of the deep trench and the interfaces 210 of the dielectric layers, accordingly shielding or protecting the walls 212 and the interfaces 210 from damage or corrosion that may occur due to exposure to a damaging medium.

In certain embodiments, the protection layer may be an acid protection layer that is resistant to acidic corrosion. This acid protection layer may be an anti-acid film or titanium nitride (TiN), silicon carbide SiC, and/or silicon nitride (SiN). The acid protection layer may be deposited to a thickness of substantially 500 Å (angstroms), or about 100 Å to about 1000 Å.

In certain embodiments, the protection layer may be a metal atom protection layer that is resistant to metal atoms from diffusing through the semiconductor device to damage the conductive features and/or conductive structures. The metal atom protection layer may include tantalum nitride (TaN), tantalum (Ta), titanium nitride (TiN), titanium (Ti), cobalt tungsten (CoW), tungsten nitride (WN), or the like. The metal atom protection layer may be deposited to a thickness of substantially 500 Å (angstroms), or about 100 Å to about 1000 Å.

In some embodiments, the protection layer may be deposited by using CVD, PVD, spin-on coating, and/or other suitable techniques to deposit the material that composes the protection layer over the semiconductor device. In depositing the protection layer, a greater quantity of the material making up the protection layer may be deposited over an area at which the deep trench is situated than in other areas where the deep trench is not situated as the surface area of the deep trench may be greater than the lateral distance of an area that spans the deep trench. In certain embodiments (not illustrated), the deep trench may be filled with the material that composes the protection layer or any other material resistant to a damaging medium to further protect the deep trench (and conductive features and/or conductive structures) from exposure to the damaging medium.

Figure 2D:
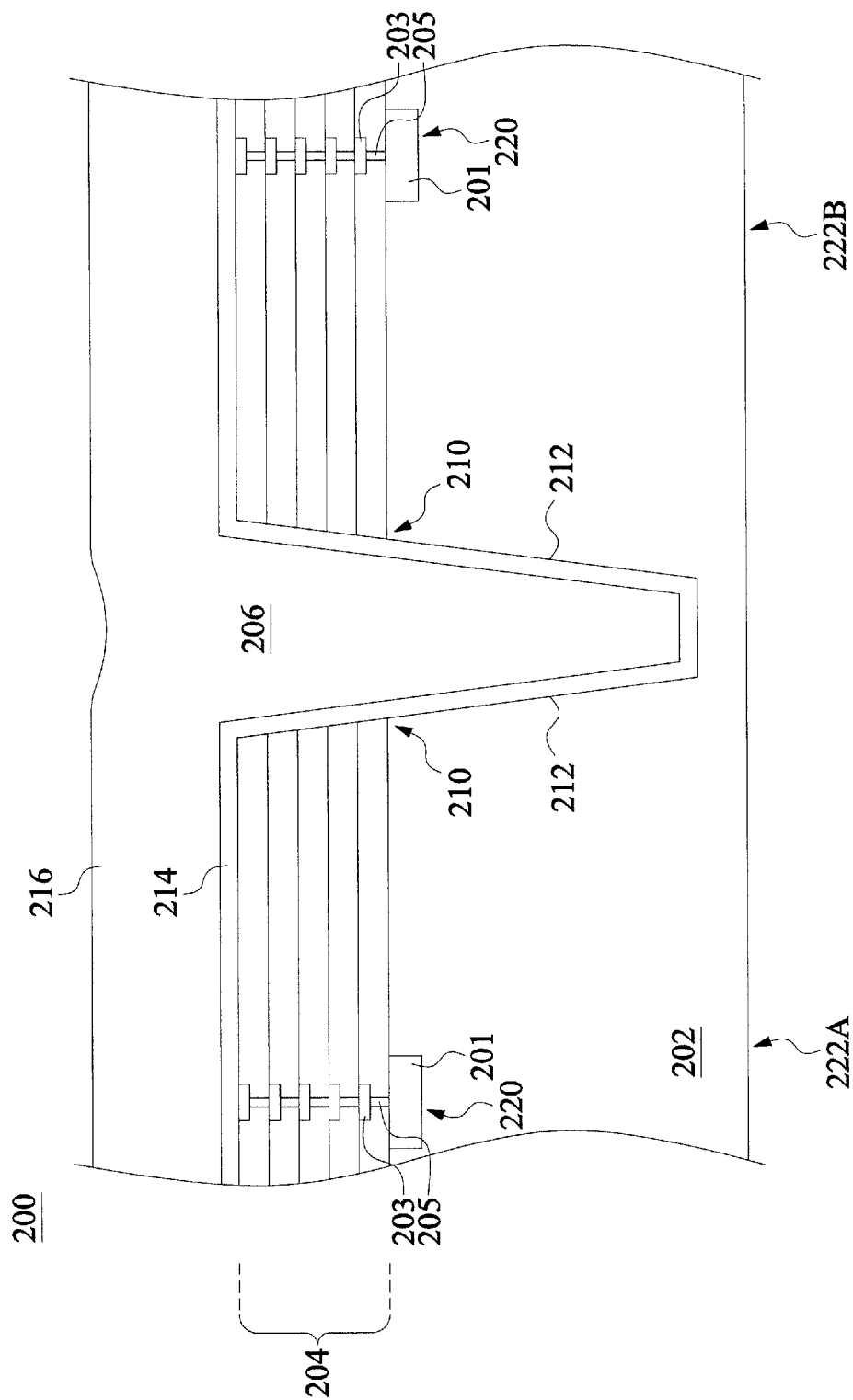

FIG. 2D is a cross-sectional view of the semiconductor device 200 including the deep trench 206 filled with a photoresist layer 216 at one of the various stages of fabrication that corresponds to operation 108 of FIG. 1, in accordance with some embodiments. As shown, the photoresist layer 216 is deposited over the deep trench 206 and the dielectric layers 204. Stated another way, the photoresist layer 216 is generally deposited on the semiconductor device 200.

The photoresist layer 216 may be formed by forming a photoresist material (e.g., a negative tone photoresist material, a positive tone photoresist material, etc.) over the semiconductor device 200 using a deposition process known in the art such as, for example, a spin-coating process, or the like. In some embodiments, the photoresist material may include an e-beam (electron beam) resist material (e.g., poly methyl methacrylate, methyl methacrylate, etc.) that is patternable in response to a e-beam lithography energy source.

As mentioned above, it is understood that these figures illustrate examples of certain embodiments and that operations may be added, modified, or omitted in accordance with different applications in various embodiments. Accordingly, although a photoresist layer is described in the illustrated embodiments of FIG. 1 and FIGS. 2D-2F, application of a photoresist may be optional and used as desired to pattern a semiconductor device in other embodiments.

Figure 2E:
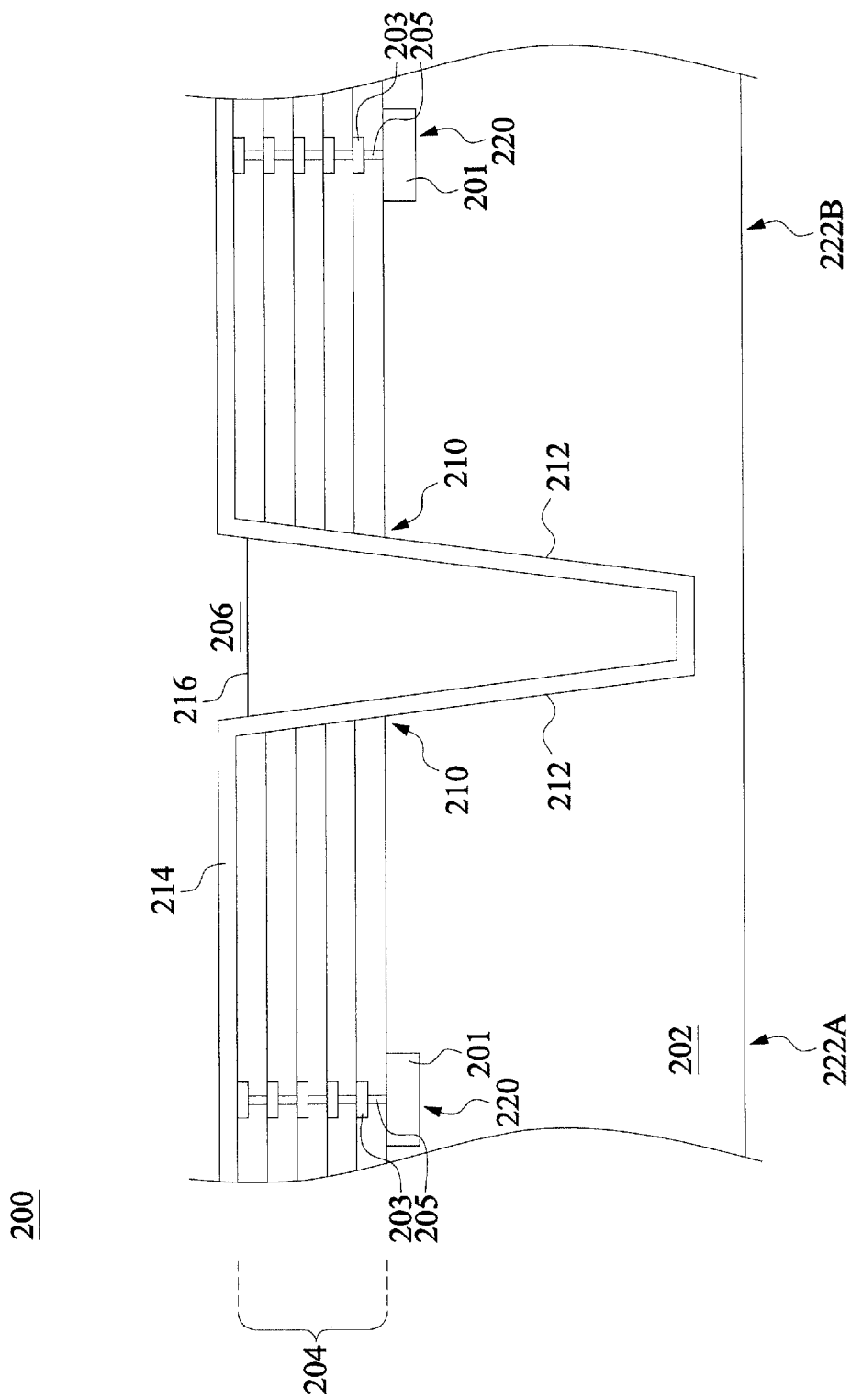

FIG. 2E is a cross-sectional view of the semiconductor device 200 including a recessed top portion of the photoresist layer at one of the various stages of fabrication that corresponds to operation 110 of FIG. 1, in accordance with some embodiments. As shown, the photoresist layer 216 may be recessed such that a top surface of the photoresist layer 216 lies below a top surface of the protection layer 214. As shown in FIG. 2E, in this case, the photoresist layer 216 does not cover the portion of the protection layer 214 over the top of the dielectric layers 204.

In certain embodiments, the photoresist material of the photoresist layer may be recessed, or patterned, in a photolithography process that may involve various exposure, developing, baking, stripping, and etching processes. In particular embodiments, the etching processes for the photoresist layer may be dry etching (as opposed to wet etching). Dry etching may include exposing the material for etching to a bombardment of ions (e.g., a plasma of reactive gases such as fluorocarbons, oxygen, chlorine, boron trichloride; sometimes with addition of nitrogen, argon, helium and other gases) that dislodge portions of the material for etching from the exposed surface. A common type of dry etching is reactive-ion etching. Dry etching process may etch directionally or anisotropically.

Figure 2F:
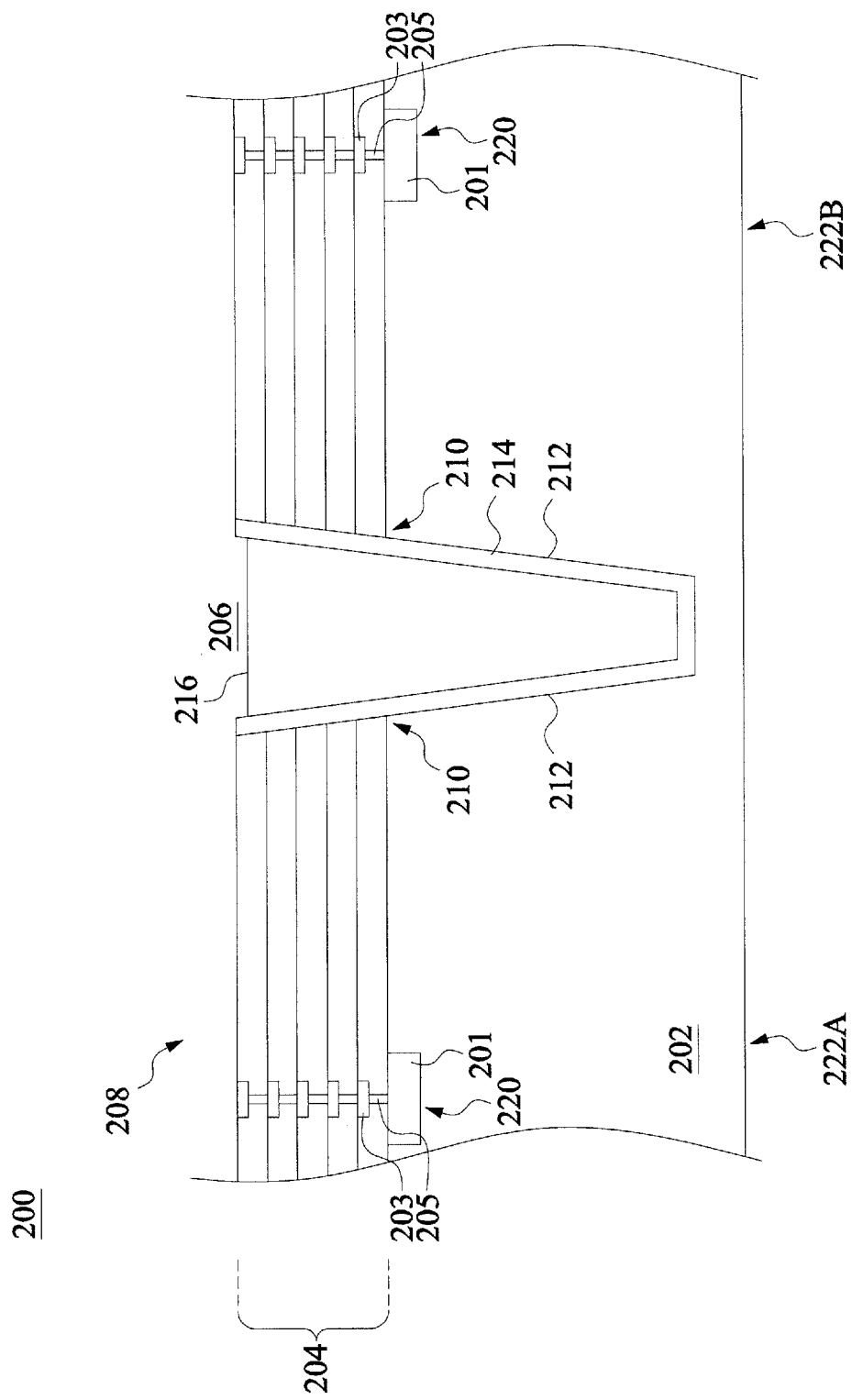

FIG. 2F is a cross-sectional view of the semiconductor device 200 in which a top portion of the protection layer 214 that overlaid the dielectric layers 204 is removed at one of the various stages of fabrication that corresponds to operation 112 of FIG. 1, in accordance with some embodiments. As shown, the portion of the protection layer 214 that overlays the dielectric layers 204 is removed but the portion of the protection layer 214 that covers the surface (e.g., walls 212) of the deep trench 206 remains.

In certain embodiments, the removed portion of the protection layer may be removed by process that may involve various exposure, developing, baking, stripping, and etching processes. In particular embodiments, the etching processes for the protection layer may be dry etching (as opposed to wet etching), introduced above. In certain embodiments, all of the protection layer may be removed aside from the protection layer along the sides of the deep trench. For example, the protection layer on the bottom of the deep trench as well as the protection layer overlaying the dielectric layers may be removed while the protection layer that covers the walls on the sides of the deep trench remain.

Figure 2G:
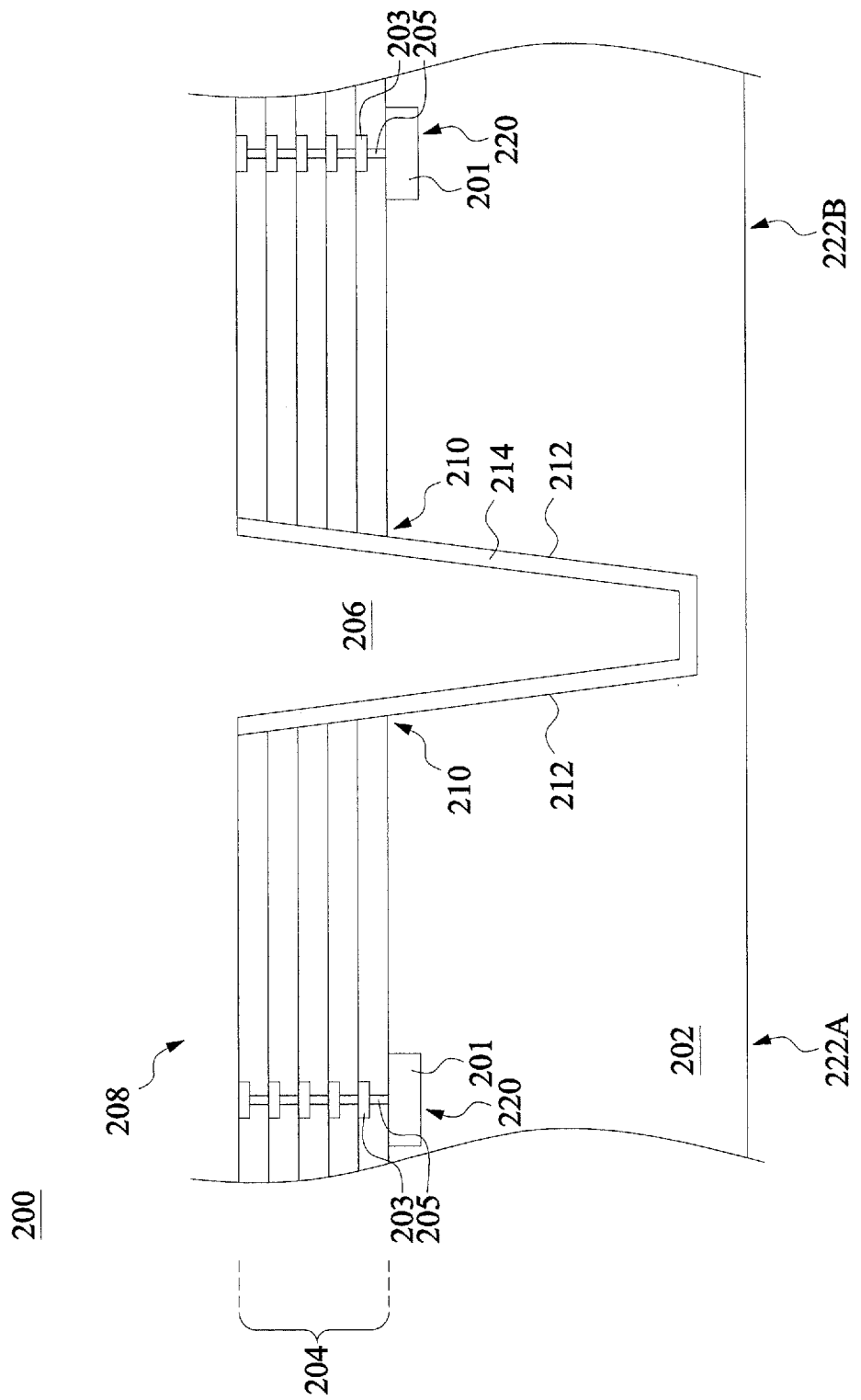

FIG. 2G is a cross-sectional view of the semiconductor device 200 in which the photoresist layer 216 is removed at one of the various stages of fabrication that corresponds to operation 114 of FIG. 1, in accordance with some embodiments. As shown, the photoresist layer 216 is removed to reveal the protection layer 214 across the deep trench.

In certain embodiments, the photoresist material of the photoresist layer may be removed, recessed, or patterned, in a photolithography process that may involve various exposure, developing, baking, stripping, and etching processes. In particular embodiments, the etching processes for the photoresist layer may be dry etching (as opposed to wet etching), as introduced above and discussed further below.

In certain embodiments, dry etching may be performed during the formation of the protection layer while wet etching may be performed after formation of the protection layer. Wet etching is a material removal process that uses liquid chemicals or etchants to remove materials. These liquid chemicals may include damaging mediums used to remove materials during semiconductor processing. However, the protection layer may include materials resistant to the damaging mediums and thus resistant to the effects of wet etching.

For example, wet etching may use an acid as a damaging medium for etching. This damaging medium, when exposed to walls of a deep trench and/or the interfaces along the walls of the deep trench, may cause damage to the structure of the deep trench and may also damage conductive features and/or conductive structures within a semiconductor device by seeping into the semiconductor device through the walls of the deep trench. Advantageously, application of a protection layer that is resistant to acid may protect the walls of the deep trench and/or the interfaces along the walls of the deep trench (and conductive features and/or conductive structures within a semiconductor device) by resisting acid seepage into the semiconductor device through the walls of the deep trench.

Accordingly, dry etching may be utilized for etching prior to protection layer formation overlaying the deep trench while wet etching may be utilized for etching after the protection layer is formed overlaying the deep trench. Advantageously, this provides for continued etching using dry and or wet etching during semiconductor processing while minimizing damage to the semiconductor device.

Figure 2H:
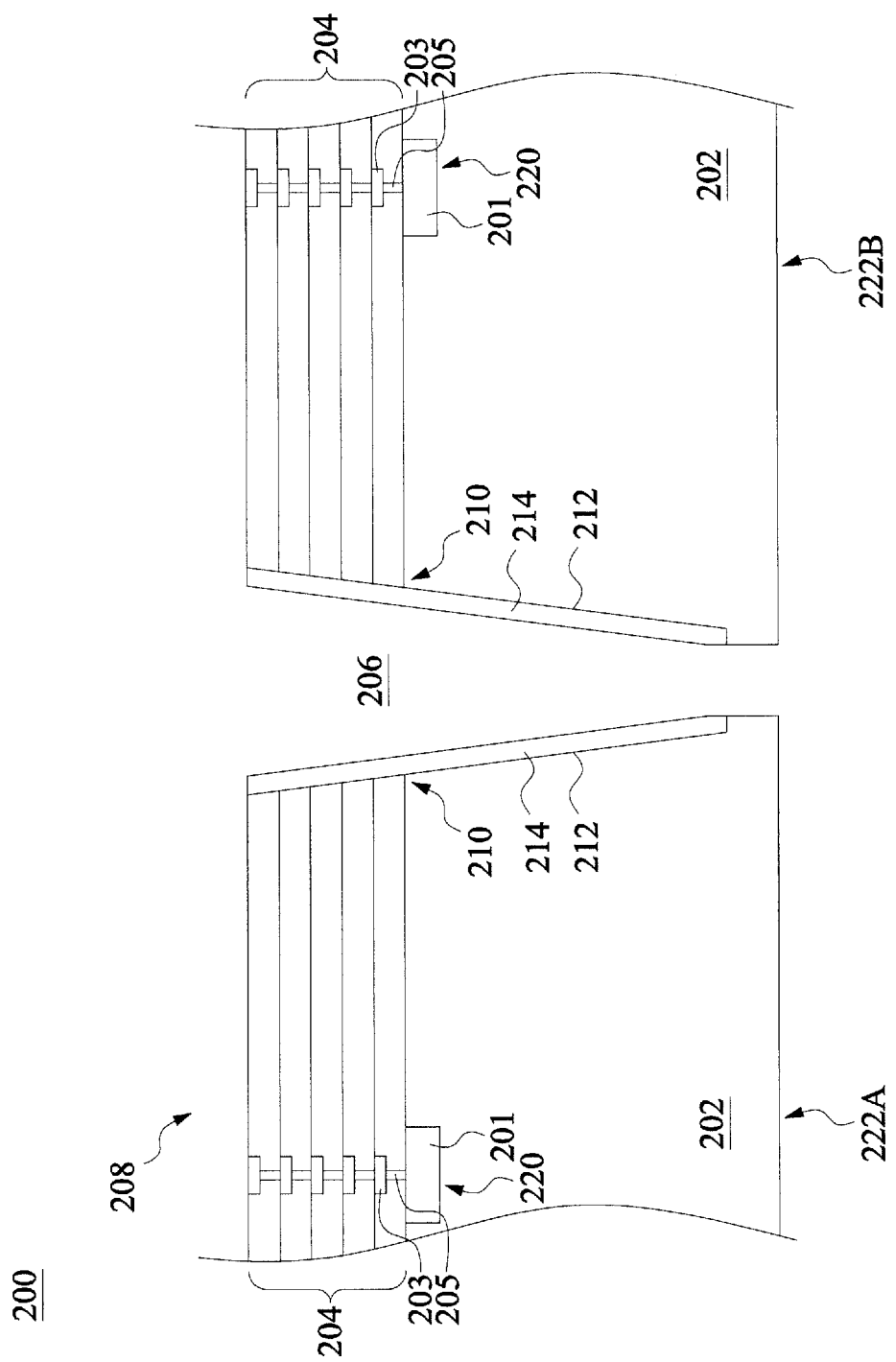

FIG. 2H is a cross-sectional view of the disassembled semiconductor device 200 with singulated dies 222A, 222B at one of the various stages of fabrication that corresponds to operation 116 of FIG. 1, in accordance with some embodiments. As shown, the bottom of the deep trench 206 has been cut to singulate (e.g., separate, or individualize) die 222A from die 222B. Also, each die 222A, 222B may be surrounded by the deep trench 206 such that when the deep trench 206 is cut, the semiconductor device 200 is disassembled to separate each die 222A, 222B on the semiconductor device 200.

Returning to FIG. 2H, in certain embodiments, dies 222A, 222B may be singulated by etching, scribing, or dicing to cut through the semiconductor device 200 and singulate the dies 222A, 222B. For example, in particular embodiments, a diamond cutting wheel may be applied along a bottom of the deep trench 206 between the individual die 222A, 222B to singulate the dies 222A, 222B. In other embodiments, lasers may be used to cut along the bottom of the deep trench to singulate the dies 222A, 222B. In yet other embodiments, etching (e.g., wet etching or dry etching) may be performed along the bottom of the deep trench to singulate the dies 222A, 222B. In further embodiments, plasma dicing may be performed using a plasma etch along the bottom of the deep trench to singulate the dies 222A, 222B.

As mentioned above, it is understood that these figures illustrate examples of certain embodiments and that operations may be added, modified, or omitted in accordance with different applications in various embodiments. Accordingly, singulation, as illustrated in FIG. 2H and described in operation 116 of FIG. 1 illustrates at least one functional use of the deep trench 206 in certain embodiments and may be optional in accordance with different applications in various embodiments.

In an embodiment, a semiconductor device includes: at least one conductive feature disposed on a substrate; at least one dielectric layer overlaying the substrate, a trench structure extending through the at least one dielectric layer; and a protection layer overlaying the trench structure.

In another embodiment, a semiconductor device includes: a first die comprising at least one conductive feature formed on a substrate, and at least one dielectric layer formed on the substrate, a trench structure at least partially surrounding the first die and extending through the at least one dielectric layer and part of the substrate; and a protection layer overlaying at least a sidewall of the trench structure.

In yet another embodiment, a method includes: forming a first dielectric layer overlaying a substrate; forming a second dielectric layer overlaying the first dielectric layer; forming a deep trench structure extending through the first dielectric layer and the second dielectric layer; and depositing a protection layer over the deep trench structure along an interface between the first dielectric layer and the second dielectric layer.

The foregoing outlines features of several embodiments so that those ordinary skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

Conditional language such as, among others, "can," "could," "might" or "may," unless specifically stated otherwise, are otherwise understood within the context as used in general to convey that certain embodiments include, while other embodiments do not include, certain features, elements and/or steps. Thus, such conditional language is not generally intended to imply that features, elements and/or steps are in any way required for one or more embodiments or that one or more embodiments necessarily include logic for deciding, with or without user input or prompting, whether these features, elements and/or steps are included or are to be performed in any particular embodiment.

Disjunctive language such as the phrase "at least one of X, Y, or Z," unless specifically stated otherwise, is otherwise understood with the context as used in general to present that an item, term, etc., may be either X, Y, or Z, or any combination thereof (e.g., X, Y, and/or Z). Thus, such disjunctive language is not generally intended to, and should not, imply that certain embodiments require at least one of X, at least one of Y, or at least one of Z to each be present.

It should be emphasized that many variations and modifications may be made to the above-described embodiments, the elements of which are to be understood as being among other acceptable examples. All such modifications and variations are intended to be included herein within the scope of this disclosure and protected by the following claims.

What is claimed is:

1. A semiconductor device, comprising:
at least one conductive feature disposed on a substrate;
at least one dielectric layer overlying the substrate;
a trench extending into the substrate after extending through the at least one dielectric layer, the trench including a trench structure sidewall extending through the at least one dielectric layer and into the substrate;
a protection layer overlaying the entirety of the trench structure sidewall, wherein the protection layer comprises titanium nitride (TiN); and
a singulation sidewall that cuts through the protection layer and the substrate.

2. The semiconductor device of claim 1, wherein the protection layer comprises a thickness of about 100 Å to about 1000 Å.

3. The semiconductor device of claim 1, wherein the protection layer extends along and directly contacts the trench structure sidewall.

4. The semiconductor device of claim 1, comprising a first dielectric layer and a second dielectric layer, the protection layer overlying a transition between the first dielectric layer and the second dielectric layer.

5. The semiconductor device of claim 1, further comprising at least one of a source, a drain, and a gate electrode of a transistor.

6. The semiconductor device of claim 1, further comprising:
a conductive structure embedded in the at least one dielectric layer, the conductive structure comprising at least one of a via and a conductive line.

7. The semiconductor device of claim 1, wherein the trench structure sidewall at least partially surrounds a first die.

8. The semiconductor device of claim 7, wherein the trench structure sidewall further at least partially surrounds a second die.

9. The semiconductor device of claim 8, wherein the trench structure sidewall separates a first dielectric layer on the first die from a second dielectric layer on the second die, wherein the first dielectric layer and the second dielectric layer both overly the substrate.

10. A semiconductor device, comprising
a first die comprising at least one conductive feature formed on a substrate, at least one dielectric layer formed on the substrate;
a trench structure extending into the substrate after extending through the at least one dielectric layer, the trench structure including a trench structure sidewall at least partially surrounding the first die and extending through the at least one dielectric layer and into the substrate;
a protection layer overlaying the trench structue sidewall, wherein the protection layer comprises titanium nitride (TiN); and
a singulation sidewall cutting through the protection layer and the substrate.

11. The semiconductor device of claim 10, comprising:
a second die, wherein the second die is arranged from the first die by the trench structure sidewall.

12. The semiconductor device of claim 1, wherein the singulation sidewall is in contact with the protection layer.

13. A semiconductor device, comprising:
at least one conductive feature disposed on a substrate;
at least one dielectric layer overlying the substrate;
a trench structure extending into the substrate at least 5.0 micrometers after extending through the at least one dielectric layer, the trench structure including first and second sidewalls extending through the at least one dielectric layer and into the substrate at least 5.0 micrometers;
a protection layer overlaying the entirety of the trench structure sidewall, wherein the protection layer comprises titanium nitride (TiN); and
a singulation sidewall that cuts through the protection layer and the substrate to separate the semiconductor device into first and second dies, wherein the first sidewall at least partially surrounds the first die and the second sidewall at least partially surrounds the second die.

14. The semiconductor device of claim 13, wherein the protection layer comprises a thickness of about 100 Å to about 1000 Å.

15. The semiconductor device of claim 13, comprising a first dielectric layer and a second dielectric layer, the protection layer overlying a transition between the first dielectric layer and the second dielectric layer.

16. The semiconductor device of claim 13, further comprising at least one of a source, a drain, and a gate electrode of a transistor.

17. The semiconductor device of claim 1, further comprising:
a conductive structure embedded in the at least one dielectric layer, the conductive structure comprising at least one of a via and a conductive line.

* * * * *